(12) United States Patent
Liao et al.

(10) Patent No.: US 11,176,046 B2
(45) Date of Patent: Nov. 16, 2021

(54) GRAPH-COMPUTING-ORIENTED HETEROGENEOUS IN-MEMORY COMPUTING APPARATUS AND OPERATIONAL METHOD THEREOF

(71) Applicant: Huazhong University of Science and Technology, Hubei (CN)

(72) Inventors: Xiaofei Liao, Hubei (CN); Yu Huang, Hubei (CN); Long Zheng, Hubei (CN); Hai Jin, Hubei (CN)

(73) Assignee: Huazhong University of Science and Technology, Wuhan (CN)

( * ) Notice: Subject to any disclaimer, the term of this patent is extended or adjusted under 35 U.S.C. 154(b) by 0 days.

(21) Appl. No.: 16/933,357

(22) Filed: Jul. 20, 2020

(65) Prior Publication Data

US 2021/0182200 A1  Jun. 17, 2021

(30) Foreign Application Priority Data

Dec. 11, 2019  (CN) .......................... 201911272006.3

(51) Int. Cl.
*G06F 12/00* (2006.01)
*G06F 12/0862* (2016.01)
*H01L 25/065* (2006.01)

(52) U.S. Cl.
CPC .. *G06F 12/0862* (2013.01); *G06F 2212/1021* (2013.01); *G06F 2212/602* (2013.01); *H01L 25/0657* (2013.01); *H01L 2225/06541* (2013.01)

(58) Field of Classification Search
CPC ..... G06F 2212/1021; G06F 2212/0602; G06F 12/0862; H01L 25/0657; H01L 2225/06541

See application file for complete search history.

(56) References Cited

U.S. PATENT DOCUMENTS

| | | | |
|---|---|---|---|
| 2007/0286483 A1* | 12/2007 | Delong | G06T 7/11 382/173 |
| 2016/0063132 A1* | 3/2016 | Chen | G06F 16/9024 707/609 |
| 2017/0091103 A1* | 3/2017 | Smelyanskiy | G06F 12/0891 |
| 2017/0286122 A1* | 10/2017 | Wu | G06F 9/5027 |
| 2017/0316591 A1* | 11/2017 | Viswanathan | G06F 16/9024 |
| 2018/0315229 A1* | 11/2018 | Kim | G06F 17/18 |
| 2019/0278808 A1* | 9/2019 | Xia | G06F 16/9024 |
| 2020/0004964 A1* | 1/2020 | Soumenkov | G06N 5/022 |
| 2020/0349063 A1* | 11/2020 | Brebner | G06F 11/3664 |
| 2020/0364053 A1* | 11/2020 | Huang | G06F 12/0895 |

OTHER PUBLICATIONS

Abraham Addisie et al.; Heterogeneous Memory Subsystem for Natural Graph Analytics; published Dec. 2018 on IEEE; retrieved at https://ieeexplore.IEEE.org/document/8573480/citations?tabFilter=papers.*

* cited by examiner

*Primary Examiner* — Prasith Thammavong
(74) *Attorney, Agent, or Firm* — Michael Ye; Morris, Manning & Martin, LLP

(57) ABSTRACT

The present invention relates to a graph-computing-oriented heterogeneous in-memory computing apparatus, comprising a memory control unit, a digital signal processing unit, and a plurality of analog signal processing units using the memory control unit.

7 Claims, 4 Drawing Sheets

GRAPH-COMPUTING-ORIENTED HETEROGENEOUS IN-MEMORY COMPUTING APPARATUS AND OPERATIONAL METHOD THEREOF

CROSS-REFERENCE TO RELATED APPLICATIONS

This application claims the benefit of the Chinese Patent Application No. 201911272006.3 filed on Dec. 11, 2019, which is incorporated by reference as herein in its entirety.

BACKGROUND OF THE INVENTION

1. Technical Field

The present invention relates to design of dedicated accelerators used in computer architecture, and more particularly to a graph-computing-oriented heterogeneous in-memory computing apparatus and an operational method thereof.

2. Description of Related Art

Graph structures can capture relation between data items naturally and allow data analysts to get valuable insight from data modes in various applications. However, graph computing is a tremendous challenge to storage systems. Irregular traversal of adjacent vertices leads to poor access locality. In addition, computation of data from a main memory is usually simple, and is demanding in terms of memory bandwidth. Although meaningful progress has been made for graph processing frameworks based on universal architectures such as FPGA and ASIC, memory-related bottlenecks seen in graph processing are far from being addressed.

Different from the traditional Von Neumann architecture that has separate layers for computing and storage, in-memory computing addresses the foregoing "memory wall" problem and improves graph-computing execution efficiency by integrating computation units in a memory. There are two major approaches to in-memory computing, and one of these is about adding or integrating digital signal processing logics (for example, tiny ordered cores, reconfigurable logics, etc.) in or near a memory. Therein, the processing logic is typically placed in the logic layer or the memory controller of a 3D stocked memory, wherein the logic layer and the storage layer are connected using through-silicon vias. According to the standard set by Micron Technology, Inc., such an arrangement provides a memory bandwidth up to 320 GB/s, and the reduced access distance in the stocked architecture also significantly reduces the overhead for data mobility by 1-2 orders of magnitude in general. The other approach to in-memory computing utilizes the inherent properties and operating principles of memory units and unit arrays so that units and/or unit arrays can use interaction therebetween to compute analog signals. Taking a ReRAM as an example, an in-memory computing architecture based on an analog memristor can effectively execute matrix vector multiplication operations in its crossbar architecture. By writing graph edge data into the resistor of the ReRAM unit, when a set of vertex data is converted into analog voltage signals actin on word lines, the ReRAM crossbar architecture can immediately execute matrix vector multiplication operations, and generate analog current signals on its bit lines. According to recent research, graph computing can be converted into the form of matrix vector multiplication, so as to utilize the large-scale parallelism of ReRAM, and to convert a matrix vector multiplication operations having computational complexity of $O(n2)$ into one with $O(1)$.

For example, China Publication No. CN108563808A discloses a design method of heterogeneous reconfigurable graph computing accelerator system based on FPGA. The accelerator system comprises two main modules, namely a PC and an FPGA. The method comprises the following steps: loading a driving module required by activation of the FPGA first and turning on devices of the FPGA, such as PCIe DMA; selecting a graph-computing accelerator engine according to a number of vertices and a number of edges of graph data to be processed; after the accelerator engine is selected, pre-processing the graph data; transmitting the pre-processed graph data to an on-board DDR of a FPGA development board through the PCIe DMA; activating the accelerator to read the graph data from and address specified by the on-board DDR; assigning the graph data to different processing units a controller for processing and computing; after each said processing unit computes and processes the data, sending results to a result-collecting module; and writing the results back to the on-board DDR using the collecting module, and after the whole graph data have been processed, reading out the results from the on-board DDR using the PC.

Therefore, the existing graph-computing accelerators based on in-memory computing architectures usually use the foregoing two in-memory computing approaches. While an in-memory computing architecture based on analog computing has good parallelism, the utilization of ReRAM units is far from good. In fact, the workload of modern graph analysis is usually very irregular because most vertices only involve a small number of edges. When they are mapped to the ReRAM crossbar architecture, a huge amount of ineffective data can exist in storage units for sparse sub-units. The storage units not used during graph processing can seriously degrade computational efficiency, generate additional power-consuming overheads for data writing and analog signal conversion, and reduce actual parallelism of graph-computing execution, thereby decreasing processing performance. Although the in-memory computing architecture based on digital signal computing has lower parallelism than analog computing due to its limitation in heat dissipation caused by the stacked structure, it can naturally filter out inefficient edges and in turn reduce redundant data transmission and computing. Thus, the two approaches each have their pros and cons for different loads, and heterogeneous architecture is desirable to graph-computing loads. The in-memory computing architecture based on digital signal computing is more suitable to sparse sub-graphs, for which it can ensure execution efficiency and reduce redundant computing. On the other hand, in-memory computing architecture based on analog signal processing is more suitable to dense sub-graphs, for which it can provide good parallelism. To sum up, the present invention is intended to provide a graph-computing-oriented heterogeneous in-memory computing apparatus that overcomes the foregoing shortcomings.

In addition, since there is discrepancy about comprehension of those skilled in the prior art and since there are many details and disclosures disclosed in literatures and patent documents that have been referred by the applicant during creation of the present invention not exhaustively recited here, it is to be noted that the present invention shall actually include technical features of all of these prior-art works, and the applicant reserves the right to supplement the application with the related art more existing technical features as support according to relevant regulations.

SUMMARY OF THE INVENTION

A word "module" as described in the description refers to a hardware, a software or any combination of a hardware and a software which can execute the function related to "module".

As a solution to the foregoing problems, the present invention provides a graph-computing-oriented heterogeneous in-memory computing apparatus, at least comprising: a storage layer, at least comprising a plurality of dynamic random access storage devices stacked with each other and vertically connected by means of through-silicon vias; and a logic layer, at least comprising a predetermined number of vaults, wherein every said vault comprises at least one digital signal processing unit, at least one memory control unit and a plurality of analog signal processing units, wherein the heterogeneous in-memory computing apparatus is configured for: performing initialization according to a graph data and a graph algorithm input to the apparatus; building a sliding-window-execution model, so that the memory control unit is able to read the graph data from the dynamic random access storage devices successively according to an execution sequence specified by the sliding-window-execution model; according to load characteristics of the read graph data and hardware real-time occupancy, assigning loads to the digital signal processing unit or the plural analog signal processing units using the memory control unit for execution, in which for a said load assigned to the digital signal processing unit for execution, the digital signal processing unit is configured to process every corresponding edge in the load successively, and updates its corresponding vertex data, or for a said load assigned to the analog signal processing unit for execution, the memory control unit converts the load into a matrix for adapting to a computation mode of the analog signal processing unit; and if the graph data does not converge, executing a next iteration.

As compared to the known solution provided in China Patent Publication No. CN108563808A, the present invention at least has the following distinct technical features. First, by building a sliding-window-execution model, the memory control unit is able to read the graph data from the dynamic random access storage device according to an execution sequence specified by the sliding-window-execution model successively. Second, the memory control unit according to load characteristics of the read graph data and hardware real-time occupancy, assigns loads to the digital signal processing unit or the plural analog signal processing units for execution. Therein, for the load assigned to the digital signal processing unit for execution, the digital signal processing unit successively processes every corresponding edge in the load, and updates its corresponding vertex data. Or for the load assigned to the analog signal processing unit for execution, the memory control unit converts the load into the form of matrices so as to adapt to the computation mode of analog signal processing units.

The technical issue for the present invention to address is: how to ensure load balance among heterogeneous computing ends. The technical effect provided by the present invention includes, in order to bring full play of execution efficiency at heterogeneous computing ends, designing the lightweight and effective load assignment mechanism adaptive to the load characteristics, wherein the most suitable computing end for a load is selected according to static graph structure characteristics and dynamic vertex state information of loads; and at last performing load assignment during operation in view of hardware real-time utilization, thereby ensuring load balance among heterogeneous computing ends.

The technical issue for the above-recited patent document to address is: how to improve bandwidth utilization and effective computing rate. The technical effect provided by the above-recited patent document includes: effectively accelerating a graph algorithm, being able to process graph data of different scale levels, and featuring for processing units that provide higher performance and lower power consumption as compared to universal processors.

To sum up, the present invention is different from the prior-art approach in terms of both objective and effective.

The present invention provides the following beneficial technical effects:

(1) providing a heterogeneous main memory computing hardware architecture supported by a load assignment model and a mechanism software system, wherein digital and analog computation units that are complementary are integrated to enhance computing efficiency and make the most use of analog computing parallelism, while ensuring execution efficiency during computing;

(2) in order to bring full play of execution efficiency at heterogeneous computing ends, designing the lightweight and effective load assignment mechanism adaptive to the load characteristics, wherein the most suitable computing end for a load is selected according to static graph structure characteristics and dynamic vertex state information of loads; and at last performing load assignment during operation in view of hardware real-time utilization, thereby ensuring load balance among heterogeneous computing ends;

(3) in order to reduce overheads for synchronization and remote data access, providing a sliding-window-execution model so that intermediate data are cached inside windows to reduce the number of times of data synchronization and lower synchronization overheads, wherein memory access requests are initiated between windows through access data in advance, thereby reducing the influence of long memory access latency and ensuring the overall efficient execution; and (4) by means of stacking storage computation units, reducing data access distance from the perspective of storage, lowering power consumption overheads caused by data moves and providing higher main memory bandwidth than the traditional main memory system, so as to satisfy the high bandwidth requirements of graph computing.

DETAILED DESCRIPTION OF THE INVENTION

The invention as well as a preferred mode of use, further objectives and advantages thereof will be best understood by reference to the following detailed description of illustrative embodiments when read in conjunction with the accompanying drawings.

For clarity, some technical terms used in this document are defined as below:

Vault: in order to enhance parallelism, a chip is divided vertically into 32 vaults each having a bottommost logic layer and an upper DRAM storage. Every vault is independent in terms of both function and operation.

ReRAM crossbar: this is also known as resistive random-access memory crossbar array, being a kind of ReRAM architecture. For increasing density and reducing costs, word lines and bit lines are interlaced to form an array.

DAC array: a digital-to-analog converter array is a device that converts discrete digital signals into continuously changing analog signals. The present invention uses this device to convert digital signals into analog signals that are then input to a ReRAM crossbar for analog computing.

ADC array: an analog-to-digital converter array is a device that converts continuously changing analog signals into discrete digital signals. The present invention uses this device to convert currents in bit lines of a ReRAM crossbar into digital signals.

On-chip eDRAM (DVB): this is a dynamic random access storage device, which comprises a large share of DRAMs and a small share of static RAMs (SRAMs) to provide faster memory access than what is achieved by using DRAMs solely. The present invention uses this device to cache intermediate results of target vertex data.

Sliding-window-execution model: a graph is divided into a plurality of sub-graphs according to target vertices, in which every sub-graph is a window and the windows are executed successively.

Address waiting for loads: this is the information of an address in a DRAM to store loads to be processed.

Source vertex buffer: this is a device used to cache the data information of source vertices corresponding to sub-graphs.

Embodiment 1

Figure 1:
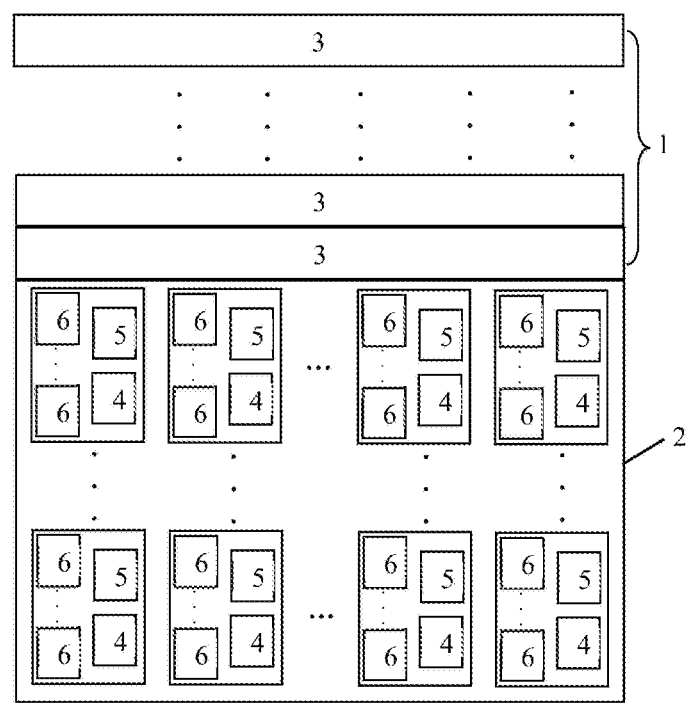
FIG. 1 shows the hardware architecture of a preferred graph-computing-oriented heterogeneous in-memory computing apparatus according to the present invention.

As shown in FIG. 1, to compensate the computing characteristics of the existing in-memory computing architecture and to satisfy heterogeneous requirements of graph-computing loads, the present invention provides a graph-computing-oriented heterogeneous in-memory computing apparatus, which uses an integrated solution to allow graph-computing loads to utilize the best of two classic in-memory computing technologies, thereby maximizing hardware execution efficiency, enhancing computing performance, and reducing power consumption. The heterogeneous in-memory computing apparatus at least comprises a storage layer 1 and a logic layer 2. The storage layer 1 and the logic layer 2 are stacked with each other. The storage layer 1 comprises a plurality of dynamic random access storage devices 3. The dynamic random access storage devices 3 are stacked with each other. Therein, the storage layer 1 and the logic layer 2 as well as two adjacent dynamic random access storage devices 3 are vertically connected by means of through-silicon vias, so as to provide high internal bandwidth, low latency and low communication overheads. Specifically, according to HMC 2.1 specifications issued by Micron Technology, Inc., the logic layer 2 may consist of a predetermined number of vaults. For example, the predetermined number may be 32. Every vault may comprise at least one digital signal processing unit 4, a memory control unit 5 and a plurality of analog signal processing units 6. A plurality of memory layers may be incorporated to provide every vault with a predetermined size of memory. For example, there may be 8 memory layers to provide every vault with up to 256 MB of memory. At last, the disclosed heterogeneous in-memory computing apparatus has a main memory up to 8 GB. For supporting communication between vaults, a mesh NoC may be used.

Figure 2:
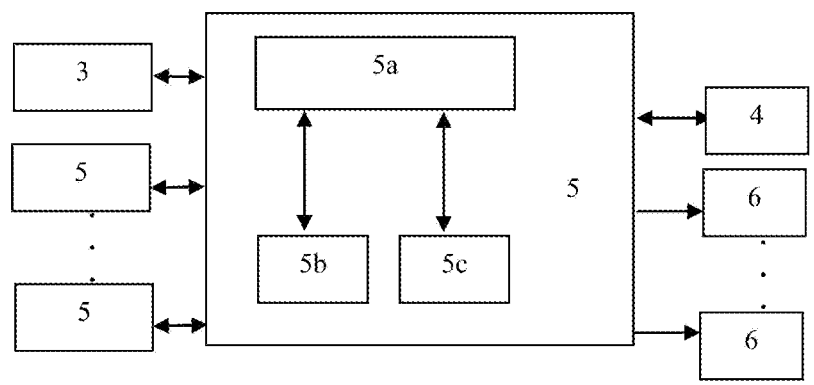
FIG. 2 is a schematic diagram illustrating the principle of a preferred memory control unit according to the present invention.

Preferably, the memory control unit 5 is used to assign workloads to the digital signal processing units 4 or the analog signal processing unit 6. As shown in FIG. 2, the memory control unit 5 at least comprises an access request managing module 5a, a first prefetching module 5b and an in-operation assignment module 5c. Specifically, the memory control unit 5 is configured to assign workloads to the digital signal processing units 4 or the analog signal processing unit 6 through steps as described below.

In the step S100, the memory control unit 5 loads data from the dynamic random access storage device 3. Wherein, before data assignment, the memory control unit 5 analyzes the workload characteristics.

Specifically, according to the analysis results of load characteristics, the apparatus determines the computing end more suitable to specific data and assigns the data to that computing end. For example, sub-graphs may be assigned to the digital signal processing units 4 or the analog signal processing units 6 according to efficient edges in every line during operation. That is, if none of the lines has more than one efficient edge, the certain sub-graph is assigned to the digital signal processing unit 4. Otherwise, the certain sub-graph assign is assigned to the analog signal processing unit 6.

In the step S200, the memory control unit 5 sends a remote access request to the memory control units 5 in other relevant vaults according to sub-graph information, based on a deterministic routing algorithm of the mesh Network-on-Chip so as to acquire the sub-graph corresponding source vertex data.

Specifically, the routing algorithm is usually used to determine through what path a data group is transmitted from the source node to the destination node in the network. The deterministic routing algorithm may be an XY-dimension ordered routing algorithm extensively used in conventional routers, which can determine an exclusive routing path as long as a source address and a destination address are specified. It expresses every router in a network as a set of two-dimensional coordinates (X, Y), and also expresses the address information in the group as a set of two-dimensional coordinates (X, Y).

In the step S300, after the memory control unit 5 acquires loads from the storage layer 1, the first prefetching module 5b generates a prefetch request, thereby reading source vertex data information relevant to the loads.

Specifically, the first prefetching module 5b is used to overlap remote data access latency and computing on the digital signal processing unit and the analog signal processing units 6.

In the step S400, after the memory control unit 5 acquires loads from the storage layer 1, the in-operation assignment module 5c assigns the loads to appropriate computing ends according to load characteristics.

Specifically, the load characteristics refer to the efficient edges in every line during operation.

In the step S500, the computing results of the digital signal processing units 4 and the analog signal processing units 6 are updated and written back to the dynamic random access storage device 3 through the memory control unit 5.

Figure 3:
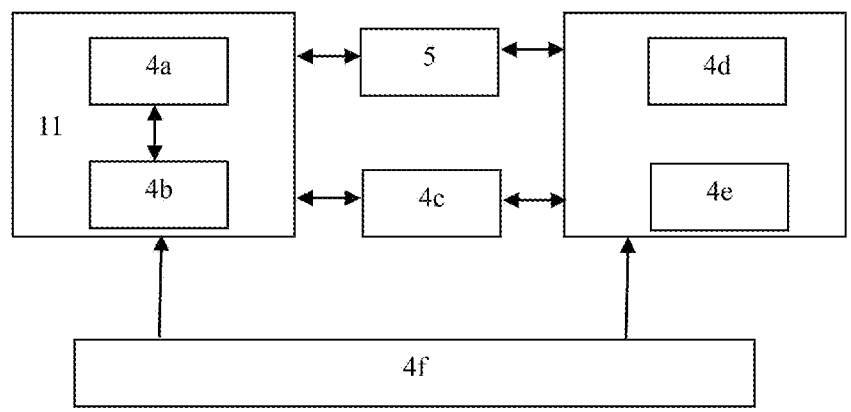
FIG. 3 is a schematic diagram illustrating the principle of a preferred digital signal processing unit according to the present invention.

Preferably, as shown in FIG. 3, the digital signal processing unit 4 may be a single core processor having the ARMv7-A architecture. It at least comprises a data processing module 4a, a second prefetching module 4b, a register 4c, a data cache module 4d, an instruction cache module 4e and a power gating control logic module 4f. The digital signal processing unit 4 executes edges assigned from the main memory control unit 5 to the data cache module 4d one by one. It decodes and executes the instructions acquired from the second prefetching module 4b. At last, the data in the data cache module 4d are transmitted to the register 4c. Preferably, the workflow of the digital signal processing unit 4 comprises at least the following steps.

In the step A1, a sequential processing core formed by the data processing module 4a and the second prefetching module 4b acquires graph structure data and algorithm-executing instructions through the memory control unit 5, and caches them in the data cache module 4d and the instruction cache module 4e, respectively.

Specifically, in computer science, a graph is a set of vertices that may be connected to each other through a series of edges. Therefore, graph structure data at least comprises a plurality of vertices and a plurality of edges. The algorithm-executing instructions may support various graph algorithms, such as breadth-first search, single-source shortest path, PageRank, etc. not limited to any specific one. All the algorithms have the same execution mode, with merely minor difference in target vertex updating operation. According to the algorithm instruction, the source vertex data are read and the relevant edges first, and then the target vertex properties are updated according to the update operation instructions of the corresponding algorithm and the source vertex properties.

In the step A2, with the assistance of the second prefetching module 4b, the data processing module 4a loads data and algorithm-executing instructions from the cache and caches them into the register 4c.

In the step A3, the data processing module 4a processes the graph data according to the algorithm-executing instructions.

Specifically, processing the graph means processing the source vertex properties according to different graph algorithms, so as to update target vertex properties.

In the step A4, the results of the processing are written back to the dynamic random access storage device 3 through the memory control unit 5, thus finishing data processing.

Specifically, the power gating control logic module 4f is in charge of turning on or off the digital signal processing units 4. After all tasks have been executed, the digital signal processing units 4 can be turned off.

Figure 4:
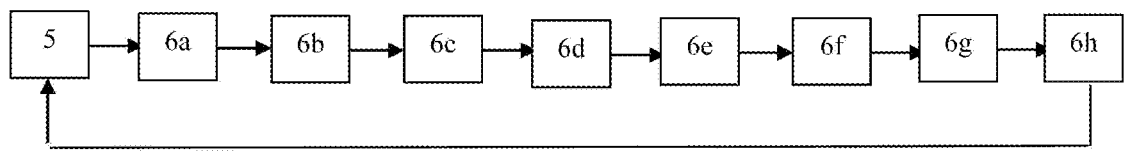
FIG. 4 is a schematic diagram illustrating the principle of a preferred analog signal processing unit according to the present invention.

Preferably, as shown in FIG. 4, the analog signal processing unit 6 at least comprises an input register 6a, a DAC array 6b, a crossbar array 6c (ReRAM crossbar), a sampling-and-retaining module 6d, an ADC array 6e, a shift and addition module 6f, a logic module 6g and an output register 6h. The ADC array 6e and the DAC array 6b convert signals. The sampling-and-retaining module 6d samples analog values and retains then before they are converted into the digital form. The logic module 6g can customize non-matrix vector multiplication operations for graph computing. The present invention integrates the analog signal processing units 6 to the logic layer of the 3D chip stacked memory, so as to significantly increase efficiency of the analog signal processing units 6 and provide higher main memory bandwidth.

Preferably, the analog signal processing units 6 process data through at least the following step.

In the step B1, the memory control unit 5 caches the source vertex data in the input register 6a, and the DAC array 6b converts the digital signals of the source vertex data into analog signals that are used as the input data for the bit lines of the crossbar array 6c.

In the step B2, the DAC array 6b writes the input data into the crossbar array 6c for the latter to perform computation.

Specifically, with the computing operation performed by the crossbar array 6c, computation results expressed in the form of current cumulative values of the bit lines of the crossbar array 6c can be obtained.

In the step B3, the sampling-and-retaining module 6d extracts the computation results of the crossbar army 6c and transmitted it to the ADC array 6e.

In the step B4, the ADC array 6e converts the computation results from analog current signals into digital signals, and the computation results can be obtained in the crossbar array through the shift-addition module 6f.

In the step B5, the logic module 6g processes the computation results of the crossbar array 6c so as to obtain the final computation results, which are then cached to the output register 6h.

Specifically, the logic module 6g is used to perform shift-addition operation on digital signals, so as to form 16-bit digital signal data.

In the step B6, the data in the output register is written back to the dynamic random access storage device 3 through the memory control unit 5.

Figure 5:
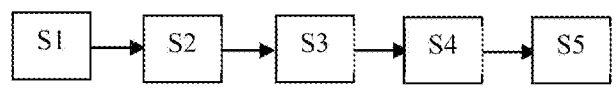
FIG. 5 is a schematic diagram illustrating the principle of a preferred heterogeneous in-memory computing apparatus of the present invention.

For easy understanding, the operational principle of heterogeneous in-memory computing apparatus of the present invention is described below with reference to FIG. 5.

Specifically, the operation of the heterogeneous in-memory computing apparatus at least comprises the following steps.

In the step S1, according to the input graph data and graph algorithms, initialization is performed on the heterogeneous in-memory computing apparatus.

Specifically, initialization means dividing graph data (comprising vertices and edges). According to the number of vertices, the vertices are evenly divided across the vaults, and the edges connected to a vertex are also put into the vault where that vertex is put in. The graph algorithm may be Prim's algorithm, Dijkstra's algorithm or Floyd-Warshall algorithm.

In the step S2, a sliding-window-execution model is built, so that memory control unit 5 can read the graph data from the dynamic random access storage device 3 successively according to an execution sequence specified by the sliding-window-execution model.

Preferably, in order to reduce overheads for synchronization and remote data access, a sliding-window-execution model is designed. In each window, intermediate data are cached so as to reduce the number of times of data synchronization, thereby lowering the synchronization overheads.

Figure 7:
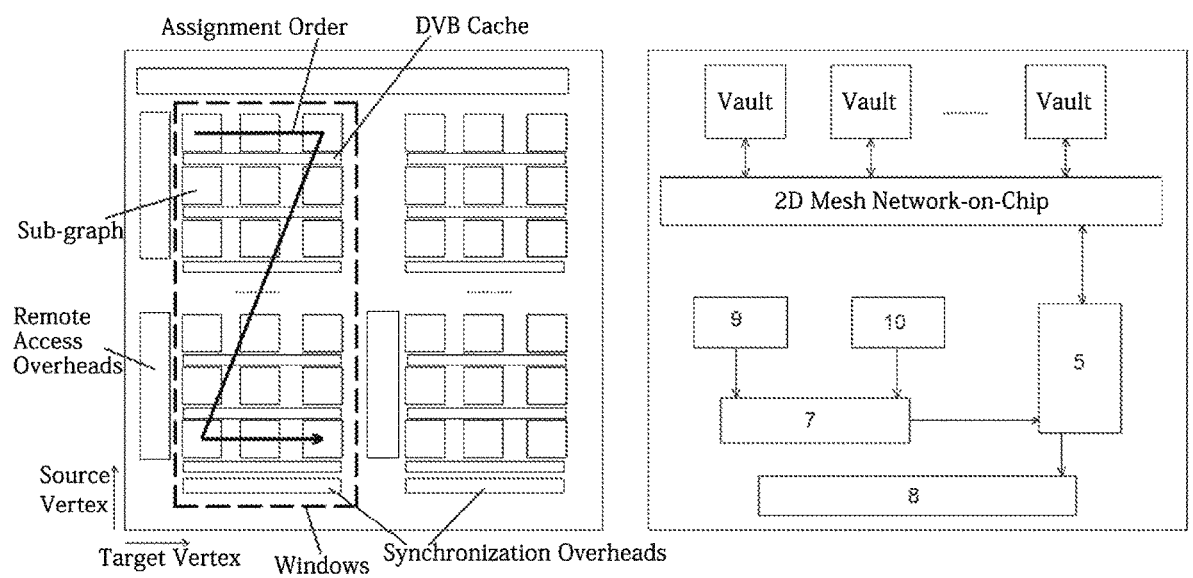
FIG. 7 is a schematic diagram illustrating a preferred load assignment model during heterogeneous in-memory computing operation according to the present invention.

Between the windows, data are prefetched so as to initiate a memory access request in advance, thereby reducing the influence of long memory access latency and ensuring the overall efficient execution. In the present invention, the assignment order of sub-graphs can also have significant influence on the overall efficiency in two aspects. The first aspect is data synchronization overheads. Edges corresponding to the target vertex may be distributed across different sub-graphs, and these sub-graphs may be executed on different computing ends. In order to ensure data consistency, the intermediate values of update of the sub-graphs are directly written back to the dynamic random access storage device 3, and this causes synchronization overheads. The second aspect is remote access overheads. If the (source or target) vertex and its related edges are not put into the same vault, remote access across vaults requires data communication through the on-chip network, and this can lead to high latency, especially when the on-chip network has congestion. Therefore, the present invention provides a sliding-window-execution model to minimize data synchronization overheads and remote access overheads. Specifically, as shown in FIG. 7, the sliding-window-execution model is built through at least the following steps.

In the step S20, according to the target vertex, the graph data are divided into individual vaults, and at least one window that can limit the range of main assignment in a sliding manner is used inside the vault, thereby forming an on-chip eDRAM to cache the intermediate data of the target vertex, so that the number of times that the data are written into the dynamic random access storage device 3 can be reduced.

In the step S21, at least two on-chip eDRAMs are provided for every vault. Therein, the first on-chip eDRAM is shared by all the digital signal processing units 4 in the vault, and the second on-chip eDRAM is shared by all the analog signal processing units 6 in the vault.

In the step S22: based on a time-division multiplexer, the overheads for data synchronization between the analog signal processing units 6 are eliminated, so that only when the intermediate results in the on-chip eDRAM need to be updated to the dynamic random access storage device 3, data synchronization is triggered.

Therefore, in every iteration, the data of each vertex data only have to be synchronized once, thereby reducing the synchronization overheads. As an additional benefit, use of the source vertex data reduces the number of times of DVB remote access, thereby reducing the remote access overheads.

In the step S23, the third prefetching module 7 and the source vertex buffering module 8 are integrated in the memory control unit 5. Therein, if the corresponding source vertex loaded into the wait queue of the digital signal processing units 4 or the analog signal processing units 6 is not in the source vertex buffering module 8, the third prefetching module 7 generates a prefetch request to hide a remote access waiting time.

Specifically, with the sliding-window-execution model, the remote access of the source vertex is sequential access having a constant stride. Every time of remote memory access is to access the data of plural continuous vertices (of a number equal to the number of lines of the ReRAM crossbar). Thus, the point is that: before execution of a load, the source vertex corresponding to the load in the sequence of the first buffer 9 or the second buffer 10 is prefetched so as to hide a remote access waiting time. To this end, the present invention integrates the third prefetching module 7 and the source vertex buffering module 8 in the memory control unit 5, so that the third prefetching module 7 can be used to prefetch data, and the source vertex buffering module 8 can be used to store the data. Different from many other prefetch technologies, the present invention can identify the source vertex to be fetched, so the prefetcher can accurately initiate the memory access request, without generating invalid access, thereby hiding the remote access latency without increasing the communication traffic of the on-chip network and reducing lag at the computing end caused by remote access. As a result, the execution efficiency of the entire architecture can be improved.

In the step S3, the memory control unit 5, according to the load characteristics of the read graph data and hardware real-time occupancy, assigns the load to the digital signal processing units 4 or the analog signal processing units 6 for execution.

Preferably, in order to bring full play of execution efficiency at heterogeneous computing ends, the lightweight and effective load assignment mechanism is such designed that it is adaptive to the load characteristics, wherein the most suitable computing end for a load is selected according to static graph structure characteristics and dynamic vertex state information of loads. At last, load assignment is performed during operation in view of hardware real-time utilization, thereby ensuring load balance among heterogeneous computing ends. Specifically, when graph data are written into the resistive random-access memory (ReRAM), the latency is usually longer than that happens during reading and computing data, especially in the case of multiple-stage writing. The ReRAM crossbar architecture usually implements multiple-line parallel writing. If every line has many useful units, the huge writing overheads for every line can be amortized. However, due to sparsity of graph computing, there is a huge amount of writing done for invalid edges. The present invention, according to the number of efficient edges in every line during operation, assigns sub-graphs to the digital signal processing units 4 or the analog signal processing units 6 for execution. To be specific, when none of the lines has more than one efficient edges, the sub-graph is assigned to the digital signal processing unit 4. Otherwise, the sub-graph is assigned to the analog signal processing unit 6.

Figure 6:
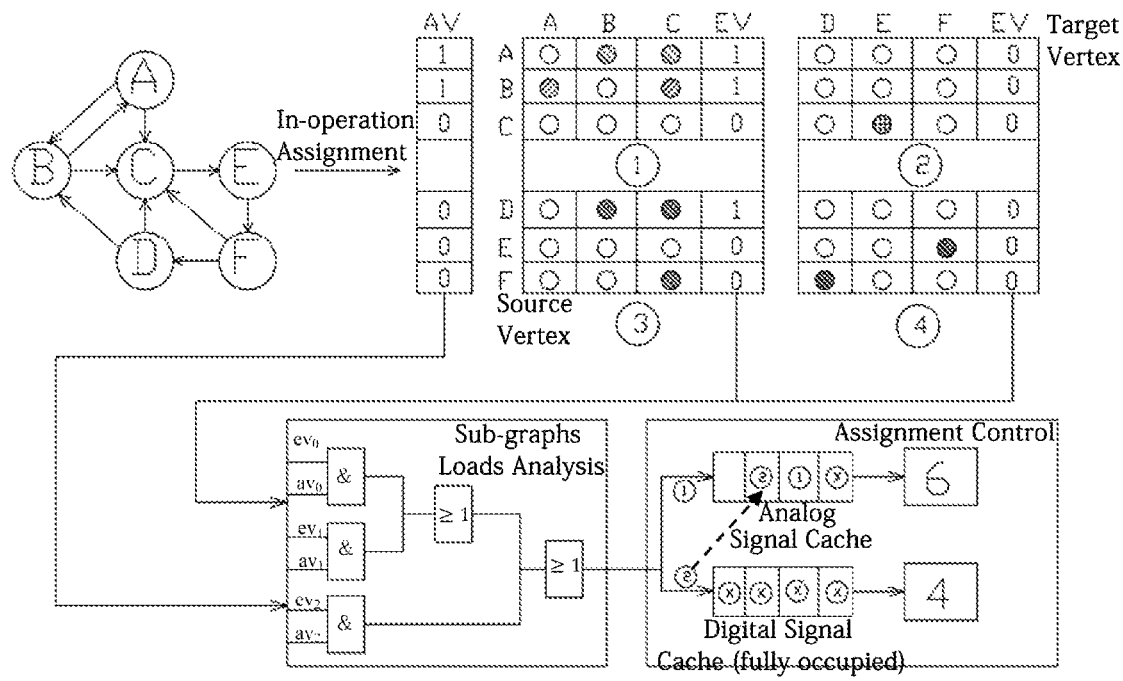
FIG. 6 is a schematic diagram illustrating a preferred load assignment mechanism during heterogeneous in-memory computing operation according to the present invention.

Preferably, as shown in FIG. 6, the entire graph structure is composed of 6 vertices and 9 directed edges. The vertices are denoted by sub-graphs, such as vertices A-F, while directed edges between the vertices are represented by directed arrows. For example, as shown, there is a directed arrow between A and C, and this indicates that there is one edge in the graph whose source vertex is A and target vertex is C. In this drawing, the vertices A, B, and C are active vertices, while E, D, and F are inactive vertices.

Preferably, referring to FIG. 6 again, the efficient edges in every line are analyzed during operation. In this respect, every sub-graph is related to two factors: the activation state of vertices (referred to as the vertex index and represented by AV in the drawing) and the graph structure (referred to as the edge index and represented by EV in the drawing). Both AV and EV have a length defined by the number of lines in a sub-graph. Every element $av_i$ in in an AV shows whether the source vertex i is activated. If yes, the $av_i$ is set as 1; otherwise 0. Every element $ev_i$ in an EV indicates whether the $i^{th}$ line in the sub-graph has more than one edge. If yes, the $ev_i$ is set as 1; otherwise 0. The vertex index AV may be captured dynamically from the vertex edges during operation. The edge index EV may be statically acquired during initial division of the graph. The address where the sub-graph is assigned to can be determined using the equation $$\bigvee_{i=0}^{n-1} (av_i \wedge ev_i) = \begin{cases} 1, & RFU \\ 0, & PU \end{cases}.$$

That is, all the $av_i$ and $ev_i$ are subject to a logical conjunction operation, and if the result is 1, the sub-graph is assigned to the analog signal processing module 6. When the result so obtained is 0, the sub-graph is assigned to the digital signal processing module 4.

Preferably, as shown in FIG. 3 and FIG. 6, a first buffer 9 is provided between the memory control unit 5 and the digital signal processing units 4, while a second buffer 10 is provided between the memory control unit 5 and the analog signal processing units 6. The first buffer 9 tracks addresses waiting for loads in the digital signal processing units 4. The second buffer 10 tracks addresses waiting for loads in the analog signal processing units 6. When the buffer zone of the first buffer 9 is fully occupied, and the buffer zone of the second buffer 10 is not fully occupied, all sub-graphs are assigned to the analog signal processing units 6 corresponding to the second buffer 10. Alternatively, when the buffer zone of the first buffer 9 is not fully occupied, and the buffer zone of the second buffer 10 is fully occupied, all sub-graphs are assigned to the digital signal processing units 4 corresponding to the first buffer 9. In practice, over-assignment may happen and cause load imbalance in the system. If the duty ratio as a result of the assignment exceeds the load capacity of the combination of the first buffer 9 and the second buffer 10, the first buffer 9 or the second buffer 10 may become a new performance bottleneck. In order to address this issue, the present invention uses an active mechanism for assignment. During graph computing, workload information during operation is dynamically monitored for facilitating making of the final decision. In other words, the first buffer 9 and the second buffer 10 are used to track the addresses waiting for loads in the digital signal processing units 4 and the analog signal processing units 6, respectively. If the relevant buffer zone is fully occupied, further assignment is stopped and the load is assigned to an idle end instead, so as to ensure hardware utilization.

In the S4, if a load is assigned to the digital signal processing unit 4 for execution, the digital signal processing unit 4 successively processes all the edges in the load, and updates the corresponding vertex data. Alternatively, if a load is assigned to the analog signal processing unit 6 for execution, the memory control unit 5 converts the load into a matrix so as to adapt to the computation mode of the analog signal processing units 6.

In the S5, if the graph does not converge, the next iteration is started.

Specifically, if there is any active vertex, the graph does not converge.

Embodiment 2

The present embodiment provides further improvements to Embodiment 1, and what is identical to its counterpart in the previous embodiment will not be repeated in the following description.

The present invention further provides a computer-readable storage medium. The computer-readable storage medium stores computer programs. The computer program when executed can implement the technical schemes described with respect to the preceding embodiments. Since the principles for implementation are alike, repeated description is omitted herein. The computer-readable storage medium may be any tangible medium that can store data and can be read using computing devices.

It should be noted that the above specific embodiments are exemplary, persons skilled in the art can devise various solutions under the inspiration of the disclosed content of the present invention, and the solutions also belong to the disclosed scope of the present invention and fall into the protection scope of the present invention. Persons skilled in the art shall understand that the specification and its drawings of the present invention are exemplary and do not limit the claims. The protection scope of the present invention is limited by the claims and its equivalents.

What is claimed is:

1. A graph-computing-oriented heterogeneous in-memory computing apparatus, at least comprising:
   a storage layer, at least comprising
   a plurality of dynamic random access storage devices stacked with each other and
   vertically connected by means of a plurality through-silicon vias; and
   a logic layer, at least comprising
   a predetermined number of vaults,
   wherein each of the vaults comprises
   at least one digital signal processing unit, wherein said digital signal processing unit comprises
   a second prefetching module, and
   at least one memory control unit, wherein said memory control unit comprises
   a first prefetching module,
   a third prefetching module and
   a source vertex buffering module, and
   a plurality of analog signal processing units; and wherein
   initialization is performed on said heterogeneous in-memory computing apparatus according to input graph data and graph algorithms, and
   wherein said graph data is read by said memory control unit successively according to an execution sequence specified by a sliding-window-execution model, wherein
   said sliding-window-execution model is built by a method comprising the following steps:
   dividing said graph data into individual vaults according to a target vertex;
   limiting a range of main assignment inside said vaults in a sliding manner by use of at least one sliding window;
   assigning loads to the at least one digital signal processing unit or the plurality of analog signal processing units using the at least one memory control unit for execution according to load characteristics of read graph data and hardware real-time occupancy;
   forming in each of said vaults at least two dynamic random access memories for intermediate data of the target vertex to be cached therein, and
   wherein at least one dynamic random access memory is shared by all digital processing units in said vault, and
   wherein at least one dynamic random access memory is shared by all said plurality of analog processing units in said vault;
   eliminating overheads for data synchronization among said plurality of analog signal processing units based on a time-division multiplexer;
   triggering data synchronization only when intermediate results in the at least two dynamic random access memories have to be updated to the plurality of dynamic random access storage devices;
   generating a prefetch request using the third prefetching module so as to hide a remote access waiting time when source vertices corresponding to the loads in a wait queue of the at least one digital signal processing unit or the plurality of analog signal processing units are not in the source vertex buffering module;

and wherein for each load assigned to the at least one digital signal processing unit for execution, the at least one digital signal processing unit is configured to process every corresponding edge in the each load successively, and updates its corresponding vertex data; and wherein for each load assigned to one of the plurality of analog signal processing units for execution, the memory control unit converts each load into a matrix for adapting to a computation mode of the analog signal processing unit; and if there is any active vertex, executing a next iteration of reading said graph data according to said execution sequence of said sliding-window-execution model.

2. The heterogeneous in-memory computing apparatus of claim 1, further comprising the steps of:

assigning the loads to the at least one digital signal processing unit or the plurality of analog signal processing units for execution according to a number of the efficient edges in each line during operation, wherein when none of the lines has more than one efficient edge, the loads are assigned to the at least one digital signal processing unit.

3. The heterogeneous in-memory computing apparatus of claim 2, wherein a first buffer is arranged between the at least one memory control unit and the at least one digital signal processing unit for tracking addresses assigned to the loads in the at least one digital signal processing unit, and a second buffer is arranged between the at least one memory control unit and the plurality of analog signal processing units for tracking addresses that are waiting for the loads in the plurality of analog signal processing units, in which:

where a buffer zone of the first buffer is fully occupied, and a buffer zone of the second buffer is not fully occupied, assigning all sub-graphs to the plurality of analog signal processing units corresponding to the second buffer, or where the buffer zone of the first buffer is not fully occupied, and the buffer zone of the second buffer is fully occupied, assigning all the sub-graphs to the at least one digital signal processing units corresponding to the first buffer.

4. The heterogeneous in-memory computing apparatus of claim 3, wherein the at least one memory control unit is configured to assign the loads to the at least one digital signal processing unit or the plurality of analog signal processing units for execution through the steps of:

loading the data from the plurality of dynamic random access storage devices, wherein before the data assignment, analysis of the workload characteristics is performed;

according to sub-graph information, based on a deterministic routing algorithm for mesh Network-on-Chip, sending a remote access request to the at least one memory control unit in corresponding vaults so as to acquire source vertex data corresponding to the sub-graphs;

after the loads are acquired from the storage layer, generating a prefetch request for reading source vertex data information relevant to the loads using a first prefetching module; and after the loads are acquired from the storage layer, according to the load characteristics, assigning the loads to appropriate computing ends using an in-operation assignment module.

5. The heterogeneous in-memory computing apparatus of claim 4, wherein the at least one data signal processing unit processes the data through at least the steps of:

acquiring graph structure data and algorithm-executing instructions through the at least one memory control unit using a sequential processing core formed by a data processing module and a second prefetching module, and caching the two in a data cache module and an instruction cache module, respectively;

loading the data and the algorithm-executing instructions from the cache modules using the data processing module with the assistance of the second prefetching module, and caching them in a register; and processing the graph data according to algorithm-executing instructions using the data processing module, in which results obtained after processing are written back to the plurality of dynamic random access storage devices through the memory control unit.

6. The heterogeneous in-memory computing apparatus of claim 5, wherein the plurality of analog signal processing units process the data through at least steps of:

caching the source vertex data into an input register using the at least one memory control unit, and converting digital signals of the source vertex data into analog signals using a DAC array so that the analog signals are used as input data of bit lines of a crossbar array;

writing the input data to the crossbar array using a DAC array, and performing computation in the crossbar array;

converting computation results from analog current signals to digital signals using an ADC array, and obtaining computation results in the crossbar array through a shift-addition module;

processing the computation results of the crossbar array using a logic module so as to obtain final computation results, which are then cached to an output register; and writing the data in the output register back to the dynamic random access storage device through the memory control unit.

7. An operational method for a graph-computing-oriented heterogeneous in-memory computing apparatus, at least comprising:

a storage layer, at least comprising a plurality of dynamic random access storage devices stacked with each other and vertically connected by means of through-silicon vias; and a logic layer, at least comprising a predetermined number of vaults, wherein every said vault comprises at least one digital signal processing unit, at least one memory control unit, wherein said memory control unit comprises a first prefetching module, a third prefetching module and a source vertex buffering module, and a plurality of analog signal processing units, wherein the operational method further comprising the following steps of:

performing initialization according to a graph data and a graph algorithm input to the apparatus;

building a sliding-window-execution model, so that the memory control unit is able to read the graph data from the plurality of dynamic random access storage devices successively according to an execution sequence specified by the sliding-window-execution model, wherein building the sliding-window-execution model at least comprises steps of:

according to a target vertex, dividing the graph data into the individual vaults, and using at least one window whose range of main assignment is limited by means of sliding in the vaults, and assigning loads to the at least one digital signal processing unit or the plurality of analog signal processing units using the at least one memory control unit for execution according to load characteristics of read graph data and hardware real-time occupancy;

forming in each of said vaults at least two dynamic random access memories for intermediate data of the target vertex to be cached therein, and wherein at least one dynamic random access memory is shared by all digital processing units in said vault, and wherein at least one dynamic random access memory is shared by all said plurality of analog processing units in said vault;

eliminating overheads for data synchronization among said plurality of analog signal processing units based on a time-division multiplexer;

triggering data synchronization only when intermediate results in the at least two dynamic random access memories have to be updated to the plurality of dynamic random access storage devices;

generating a prefetch request using a third prefetching module so as to hide a remote access waiting time when source vertices corresponding to the loads in a wait queue of the at least one digital signal processing unit or the plurality of analog signal processing units are not in the source vertex buffering module;

and wherein for each load assigned to the at least one digital signal processing unit for execution, the at least one digital signal processing unit is configured to process every corresponding edge in the each load successively, and updates its corresponding vertex data;

and wherein for each load assigned to one of the plurality of analog signal processing units for execution, the memory control unit converts each load into a matrix for adapting to a computation mode of the analog signal processing unit; and if there is any active vertex, executing a next iteration of reading said graph data according to said execution sequence of said sliding-window-execution model.

\* \* \* \* \*